(12) United States Patent
Sabathil et al.

(10) Patent No.: US 9,324,920 B2
(45) Date of Patent: Apr. 26, 2016

(54) OPTOELECTRONIC SEMICONDUCTOR COMPONENT HAVING A TRANSPARENT OXIDE CONNECTOR AND METHOD FOR FABRICATING THE SAME

(71) Applicant: OSRAM Opto Semiconductors GmbH, Regensburg (DE)

(72) Inventors: Matthias Sabathil, Regensburg (DE); Andreas Ploessl, Regensburg (DE); Norwin von Malm, Nittendorf (DE); Alexander Linkov, Regensburg (DE); Lutz Hoeppel, Alteglofsheim (DE); Christopher Koelper, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/348,519

(22) PCT Filed: Sep. 24, 2012

(86) PCT No.: PCT/EP2012/068783
§ 371 (c)(1),
(2) Date: Mar. 28, 2014

(87) PCT Pub. No.: WO2013/045399
PCT Pub. Date: Apr. 4, 2013

(65) Prior Publication Data
US 2014/0225149 A1    Aug. 14, 2014

(30) Foreign Application Priority Data
Sep. 30, 2011    (DE) .......................... 10 2011 114 641

(51) Int. Cl.
*H01L 33/48*    (2010.01)
*H01L 33/20*    (2010.01)
(Continued)

(52) U.S. Cl.
CPC ................ *H01L 33/48* (2013.01); *H01L 33/20* (2013.01); *H01L 31/0232* (2013.01); *H01L 33/22* (2013.01);
(Continued)

(58) Field of Classification Search
CPC ....................................................... H01L 31/0232
See application file for complete search history.

(56) References Cited

U.S. PATENT DOCUMENTS 5,142,595 A * 8/1992 Chester ........................... 385/37
6,640,032 B2 * 10/2003 Kondo et al. .................... 385/51
(Continued)

FOREIGN PATENT DOCUMENTS

DE    102008012407 A1    8/2009
DE    102009019161 A1    11/2010
(Continued)

OTHER PUBLICATIONS

Gordon, R., et al., "A Kinetic Model for Step Coverage by Atomic Layer Deposition in Narrow Holes or Trenches," Chemical Vapor Deposition, vol. 9, Mar. 20, 2003, pp. 73-78.
(Continued)

*Primary Examiner* — Ida M Soward
(74) *Attorney, Agent, or Firm* — Slater & Matsil, L.L.P.

(57) ABSTRACT

An optoelectronic semiconductor component includes an optoelectronic semiconductor chip and an optical element. A connecting layer includes a transparent oxide arranged between the semiconductor chip and the optical element. The connecting layer directly adjoins the semiconductor chip and the optical element and fixes the optical element on the semiconductor chip. A method for fabricating an optoelectronic semiconductor component is furthermore specified.

17 Claims, 5 Drawing Sheets

(51) Int. Cl.
  *H01L 33/00* (2010.01)
  *H01L 31/02* (2006.01)
  *H01L 31/0232* (2014.01)
  *H01L 33/50* (2010.01)
  *H01L 33/58* (2010.01)
  *H01L 33/22* (2010.01)

(52) U.S. Cl.
  CPC ............ *H01L 33/486* (2013.01); *H01L 33/507* (2013.01); *H01L 33/58* (2013.01); *H01L 2924/0002* (2013.01); *H01L 2933/0041* (2013.01)

(56) References Cited

U.S. PATENT DOCUMENTS

| | | | | |
|---|---|---|---|---|
| 6,669,803 | B1* | 12/2003 | Kathman et al. | 156/250 |
| 7,351,951 | B2* | 4/2008 | Van Arendonk | 250/239 |
| 7,804,147 | B2* | 9/2010 | Tarsa et al. | 257/433 |
| 8,049,234 | B2* | 11/2011 | Camras | H01L 33/58 257/100 |
| 8,455,910 | B2* | 6/2013 | Chiang et al. | 257/99 |
| 9,029,901 | B2* | 5/2015 | Ramchen et al. | 257/99 |
| 2003/0211648 | A1* | 11/2003 | Buchanan et al. | 438/48 |
| 2004/0183081 | A1* | 9/2004 | Shishov | H01L 33/501 257/79 |
| 2006/0237810 | A1* | 10/2006 | Sand et al. | 257/434 |
| 2007/0158661 | A1 | 7/2007 | Lu et al. | |
| 2008/0107999 | A1* | 5/2008 | Nakano | 430/397 |
| 2008/0265268 | A1* | 10/2008 | Braune et al. | 257/98 |
| 2009/0166664 | A1* | 7/2009 | Park et al. | 257/99 |
| 2010/0051982 | A1* | 3/2010 | Lin et al. | 257/98 |
| 2010/0181589 | A1* | 7/2010 | Huang | H01L 33/486 257/98 |
| 2011/0050988 | A1* | 3/2011 | Yano et al. | 348/374 |
| 2011/0062469 | A1* | 3/2011 | Camras et al. | 257/98 |
| 2011/0140152 | A1 | 6/2011 | Song | |
| 2011/0285017 | A1* | 11/2011 | Ninz et al. | 257/737 |
| 2012/0001208 | A1* | 1/2012 | Brick et al. | 257/89 |
| 2012/0164387 | A1* | 6/2012 | Watanabe et al. | 428/156 |
| 2012/0193660 | A1* | 8/2012 | Donofrio et al. | 257/98 |
| 2012/0202077 | A1* | 8/2012 | Kim et al. | 428/446 |
| 2012/0218773 | A1* | 8/2012 | Peiler et al. | 362/520 |
| 2012/0261703 | A1* | 10/2012 | Zimmerman et al. | 257/98 |
| 2013/0126935 | A1* | 5/2013 | Zitzlsperger et al. | 257/99 |
| 2013/0293145 | A1* | 11/2013 | Camras et al. | 315/294 |
| 2015/0014732 | A1* | 1/2015 | DeMille et al. | 257/98 |

FOREIGN PATENT DOCUMENTS

| | | |
|---|---|---|
| WO | 2007097137 A1 | 8/2007 |
| WO | 2009061704 A2 | 5/2009 |
| WO | 2011033406 A2 | 3/2011 |
| WO | 2011085889 A1 | 7/2011 |

OTHER PUBLICATIONS

Schnitzer, I., et al., "30% external quantum efficiency from surface textured, thin-film light-emitting diodes," Applied Physics Letter 63(16), Oct. 18, 1993, 3 pages.

* cited by examiner

OPTOELECTRONIC SEMICONDUCTOR COMPONENT HAVING A TRANSPARENT OXIDE CONNECTOR AND METHOD FOR FABRICATING THE SAME

This patent application is a national phase filing under section 371 of PCT/EP2012/068783, filed Sep. 24, 2012, which claims the priority of German patent application 10 2011 114 641.9, filed Sep. 30, 2011, each of which is incorporated herein by reference in its entirety.

TECHNICAL FIELD

An optoelectronic semiconductor component and a method for fabricating an optoelectronic semiconductor component are specified.

BACKGROUND

The optical efficiency of a light emitting diode (LED) is greatly influenced by the difference between and the matching of the refractive indexes of the light emitting diode chip and of a functional optical element applied thereto, for example, a phosphor layer or a lens. The connection between the light emitting diode chip, which comprises a high refractive index semiconductor material having a refractive index in the range of 2.4 to 3.5, and, for example, a ceramic phosphor layer having a refractive index in the range of 1.8 to 2.8 or a glass lens having a refractive index in the range of 1.46 to 2.1 is usually produced by a low refractive index silicone layer having a refractive index in the range of 1.4 to 1.55, which leads to significant optical losses of approximately 5% to 10%. In order to increase the coupling-out efficiency of an LED and in order, in particular, to be able to advance to efficiencies of more than 150 lumens per watt, it is necessary to minimize such optical losses as much as possible.

The endeavor to couple optical elements to a light emitting diode chip as far as possible without layers having a low refractive index is known. By way of example, attempts are made to use conventional adhesive layers having the highest possible refractive index. However, since there are no optical adhesives exhibiting long-term stability and having refractive indexes of more than 1.55, this approach has been limited hitherto. Furthermore, attempts are made to apply an optical element without adhesion layers on a light emitting diode chip by means of direct bonding. Although direct bonding would constitute the best connection optically and thermally, in practice it is useable only to a very limited extent on account of the stringent requirements of the surface quality. Furthermore, the direct deposition of semiconductor materials on an optical element is also discussed. However, the direct deposition of epitaxial material on optically active substances has not yet been sufficiently demonstrated hitherto and furthermore very greatly restricts the choice of the suitable materials to be used.

SUMMARY OF THE INVENTION

Specific embodiments specify an optoelectronic semiconductor component comprising an optical element on a semiconductor chip. Further specific embodiments specify a method for fabricating an optoelectronic semiconductor component.

In accordance with one embodiment, an optoelectronic semiconductor component comprises an optoelectronic semiconductor chip and an optical element. A connecting layer is arranged between the optical element and the semiconductor chip, which connecting layer in each case directly adjoins the optical element and the semiconductor chip and fixes the optical element on the semiconductor chip. Here and hereinafter, "directly adjoin" means that no further layer, in particular for example in the form of an adhesive layer, a connecting resin layer or a solder layer, is situated between the connecting layer described here and the semiconductor chip and between the connecting layer and the optical element. The connecting layer is therefore arranged directly at the semiconductor chip and directly at the optical element between these.

A mechanical coupling and fixing of the optical element on the semiconductor chip can be made possible by the direct arrangement of the connecting layer at the semiconductor chip and at the optical element. Furthermore, the connecting layer can make possible a good thermal and optical coupling of the optical element to the semiconductor chip.

In accordance with a further embodiment, the connecting layer comprises a transparent oxide. Particularly preferably, the connecting layer has a refractive index of greater than or equal to 1.6. Optical losses such as, for example, when using silicone-based adhesives for fixing optical elements on light emitting diode chips can be reduced as a result.

In accordance with a further embodiment, in a method for fabricating an optoelectronic semiconductor component, the optical element is arranged on the optoelectronic semiconductor chip. The connecting layer, which can be embodied in particular as a connecting layer comprising a transparent oxide, is then applied between the semiconductor chip and the optical element in each case in a manner directly adjoining the semiconductor chip and the optical element. The optical element is fixed on the semiconductor chip as a result of the direct application of the connecting layer between the optical element and the semiconductor chip.

The features described here and hereinafter apply equally to the optoelectronic semiconductor component and the method for fabricating the latter.

Particularly preferably, the connecting layer is arranged between the semiconductor chip and the optical element by means of an atomic layer deposition (ALD) method. In the method of atomic layer deposition, formation of a layer made from a connecting layer material on a surface or a surface region of the semiconductor chip and a surface or a surface region of the optical element is made possible by a chemical reaction of at least two starting substances or compounds ("precursor") provided in gaseous form. In comparison with other methods of chemical vapor deposition, in atomic layer deposition the starting compounds are admitted into a reaction chamber cyclically one after another. A first of the at least two gaseous starting compounds can adsorb on the surfaces to be coated, wherein the molecules of the first starting compound can be arranged irregularly and without a long-range order on the surface region and can thus form an at least partly amorphous covering. After the surfaces have been preferably completely or almost completely covered with the first starting compound, a second of the at least two starting compounds can be supplied, which reacts with the first starting compound adsorbed on the surface to be coated, as a result of which a submonolayer or maximally a monolayer of the connecting layer material can be formed. Further submonolayers or monolayers can be produced by repeating these steps. An essential feature of atomic layer deposition is the self-limiting character of the partial reaction, which means that the starting compound of a partial reaction does not react with itself or ligands of itself, which limits the layer growth in a partial reaction, even in the case of an arbitrary length of time and amount of gas, to maximally a monolayer of the connecting layer material on the surfaces or surface regions to be coated. Depending on method parameters and reaction chamber, and also depending on the connecting layer material or the starting compounds thereof, a cycle can last between a few milliseconds and a few seconds, wherein a layer made from the connecting layer material and having a thickness of approximately 0.1 to approximately 3 angstroms can then be produced per cycle.

What is of particular importance in the case of the method described here and in the case of the optoelectronic semiconductor component described here is that ALD methods have the property of conformally coating structures with high so-called aspect ratios of more than 100 or more than 1,000, depending on process parameters. Here and hereinafter, aspect ratio denotes, in the case of a channel or a gap, the ratio of channel or gap depth to the minimum width, that is to say to the width at the narrowest location, of the channel or gap. Consequently, after the optical element has been arranged on the semiconductor chip, gaps which may be present between the optical element and the semiconductor chip and which may be produced in a manner governed by manufacture and/or in a targeted manner by means of a surface structuring can be filled by the material of the connecting layer. As a result of the high gap penetration and the conformal filling behavior, which is, for example, already known from the coating or filling of deep and narrow blind holes such as, for instance, so-called "vias," a thin-gap adhesive bond is achieved by the connecting layer described here by means of the ALD method. As a result of the conformal coating that can be achieved by the ALD method, the method described here for applying the connecting layer between the semiconductor chip and the optical element can also subsequently be distinguishable from other methods and demonstrable.

In accordance with a further embodiment, the optoelectronic semiconductor chip has a semiconductor layer sequence. The semiconductor chip can be embodied as a light emitting semiconductor chip or as a light detecting semiconductor chip, for example, in the form of a photodiode or a photovoltaic cell. The semiconductor chip can have a semiconductor layer sequence based on different semiconductor material systems, depending on wavelength. A semiconductor layer sequence based on $In_xGa_yAl_{1-x-y}As$, for example, is suitable for a long-wave, infrared to red radiation, a semiconductor layer sequence based on $In_xGa_yAl_{1-x-y}P$, for example, is suitable for red to yellow radiation, and a semiconductor layer sequence based on $In_xGa_yAl_{1-x-y}N$, for example, is suitable for short-wave visible, that is to say in particular for green to blue, radiation and/or for UV radiation, where $0 \leq x \leq 1$ and $0 \leq y \leq 1$ in each case hold true. Furthermore, a semiconductor layer sequence based on an antimonide, for example, InSb, GaSb, AlSb or a combination thereof, can be suitable for long-wave infrared radiation.

Particularly preferably, the semiconductor chip can comprise or be composed of an epitaxially grown semiconductor layer sequence. For this purpose, the semiconductor layer sequence can be grown on a growth substrate by means of a epitaxy method, for example, metal organic vapor phase epitaxy (MOVPE) or molecular beam epitaxy (MBE), and be provided with electrical contacts. A plurality of semiconductor chips can be provided by singulating the growth substrate with the grown semiconductor layer sequence.

Furthermore, the semiconductor layer sequence can be transferred to a carrier substrate before singulation and the growth substrate can be thinned or completely removed. Such semiconductor chips which have as substrate a carrier substrate instead of the growth substrate can also be designated as so-called thin-film semiconductor chips.

A thin-film semiconductor chip is distinguished, in particular, by the following characteristic features. A reflective layer is applied or formed at a first main area of a radiation-generating epitaxial layer sequence facing toward the carrier substrate. The reflective layer reflects at least part of the electromagnetic radiation generated in the epitaxial layer sequence back into the latter. The epitaxial layer sequence has a thickness in the range of 20 µm or less, in particular in the range of between 4 µm and 10 µm. The epitaxial layer sequence contains at least one semiconductor layer having at least one area having an intermixing structure which ideally leads to an approximately ergodic distribution of the light in the epitaxial layer sequence, that is to say that it has an as far as possible ergodically stochastic scattering behavior.

A thin-film semiconductor chip is to a good approximation a Lambertian surface emitter. The basic principle of a thin-film light emitting diode chip is described, for example, in the document I. Schnitzer, et al., Appl. Phys. Lett. 63 (16), Oct. 18, 1993, 2174-2176.

The electrical contacts of the semiconductor chip can be arranged on different sides of the semiconductor layer sequence or else on the same side. By way of example, the semiconductor chip can have an electrical contact in the form of a solderable or adhesively bondable contact area on a side of the substrate situated opposite the semiconductor layer sequence. A further contact area, for example, in the form of a so-called bonding pad for making contact by means of a bonding wire, can be formed on a side of the semiconductor layer sequence situated opposite the substrate. Furthermore, the semiconductor chip can have the electrical contact areas on the same side, for example, as solderable or adhesively bondable contact areas, and can be embodied as a so-called flip-chip, which can be mounted with the contact areas on an electrically conductive carrier, for example, a circuit board, a printed circuit board or a light emitting diode housing. Furthermore, a semiconductor chip can also have two contact areas embodied as bonding pads on the same side of the semiconductor layer sequence.

In accordance with a further embodiment, the optical element comprises a transparent or translucent material through which, during the operation of the optoelectronic semiconductor component, light is emitted from the semiconductor chip embodied as a light emitting semiconductor chip, or through which light can be received by the semiconductor chip embodied as a light detecting semiconductor chip. The optical element can comprise, for example, a glass, a ceramic material, a plastic, a semiconductor material or a combination of materials mentioned. By way of example, the optical element can be embodied as a transparent substrate, particularly preferably as a glass, ceramic or semiconductor substrate.

The optical element can for example also serve as an intermediate carrier arranged between the semiconductor chip and a further optical element, which is connected to the optical element, for example, via a further connecting layer, wherein the further connecting layer can have features as described in association with the connecting layer between the optical element and the semiconductor chip.

In accordance with a further embodiment, the optical element has a surface which faces away from the semiconductor chip and which has a curved or other non-planar form. By way of example, the surface facing away from the semiconductor chip can be curved concavely or convexly in a lens-like fashion, for example in the form of a spherical or aspherical lens. Furthermore, the surface of the optical element which faces away from the semiconductor chip can for example comprise one or a plurality of cones or truncated cones or can be formed by one or a plurality thereof. In particular, the optical element having such a surface can serve for the beam shaping or scattering of the emitted light from a light emitting semiconductor component.

In accordance with a further embodiment, the optical element is embodied as a wavelength conversion element or comprises a wavelength conversion element. The wavelength conversion element can comprise one or a plurality of wavelength conversion substances suitable for at least partly absorbing the light emitted by the semiconductor chip and for emitting it as light having an at least partly different wavelength range. The wavelength conversion element can for example comprise one or more of the following wavelength conversion substances or be formed from one or more of the following wavelength conversion substances: garnets doped with rare earth metals, alkaline earth metal sulfides doped with rare earth metals, thiogallates doped with rare earth metals, aluminates doped with rare earth metals, silicates, such as orthosilicates, doped with rare earth metals, chlorosilicates doped with rare earth metals, alkaline earth metal silicon nitrides doped with rare earth metals, oxynitrides doped with rare earth metals and aluminum oxynitrides doped with rare earth metals, silicon nitrides doped with rare earth metals, sialons.

In particular, garnets such as yttrium aluminum oxide (YAG), lutetium aluminum oxide (LuAG) and terbium aluminum oxide (TAG) can be used as wavelength conversion substances. The wavelength conversion substances are doped for example with one of the following activators: cerium, europium, terbium, praseodymium, samarium, manganese.

Furthermore, the wavelength conversion element can comprise as wavelength conversion substance additionally or alternatively an organic material, which can be selected from a group comprising praseodymium, benzopyrenes, coumarins, rhodamines, and azo dyes.

The wavelength conversion element can also comprise suitable mixtures and/or combinations of the wavelength conversion substances mentioned.

Furthermore, the wavelength conversion element can be formed from one or more wavelength conversion substances and can be present, for example, as a ceramic wavelength conversion element.

Furthermore, the wavelength conversion element can comprise a matrix material which surrounds or contains the wavelength conversion substance or substances or which is chemically bonded to the wavelength conversion substance or substances. The transparent matrix material can comprise, for example, siloxanes, epoxides, acrylates, methyl methacrylates, imides, carbonates, olefins, styrenes, urethanes or derivatives thereof in the form of monomers, oligomers or polymers and furthermore also mixtures, copolymers or compounds therewith. By way of example, the matrix material can comprise or be an epoxy resin, polymethyl methacrylate, polystyrene, polycarbonate, polyacrylate, polyurethane or a silicone resin such as, for instance, polysiloxane or mixtures thereof.

Furthermore, the wavelength conversion element can also be present as a ceramic wavelength conversion element and comprise a ceramic material or a glass material as matrix material containing one or more of the wavelength conversion substances mentioned above.

The wavelength conversion substance or substances can be distributed homogenously in the matrix material. Furthermore, the wavelength conversion element can comprise a plurality of wavelength conversion substances arranged in different layers in the wavelength conversion element.

As a result of the connecting layer, a good thermal and optical linking of the wavelength conversion substance or substances in the wavelength conversion element to the semiconductor chip can be made possible, which can be particularly advantageous, for example, in the case of a ceramic wavelength conversion element and can result in an increase in the efficiency. Furthermore, in particular a ceramic wavelength conversion element can also serve as mechanical stabilization of the semiconductor chip, for example, in the case of a semiconductor chip embodied as a flip-chip with removed or thinned growth substrate.

In accordance with a further embodiment, the optical element can be embodied as a scattering element and comprise scattering particles or scattering structures. In this case, the scattering particles or scattering structures can be arranged on a surface of the optical element, in particular the surface facing away from the semiconductor chip, in the form of a surface structure or they can be included in a matrix material as an alternative or in addition to a wavelength conversion substance as described above. In particular, the scattering particles can comprise or be, for example, a semimetal or metal oxide, thus for instance silicon dioxide, titanium dioxide or aluminum oxide, and/or glass particles and/or pores, thus for instance air inclusions. The scattering particles or scattering structures can in this case have diameters or grain sizes of less than one micrometer up to an order of magnitude of 10 micrometers or up to 100 micrometers.

In accordance with a further embodiment, the connecting layer comprises a dielectric transparent oxide. By way of example, the connecting layer can comprise aluminum oxide, titanium dioxide, zirconium dioxide, tantalum pentoxide, hafnium dioxide, silicon dioxide, silicon nitride or a combination thereof.

In accordance with a further embodiment, the connecting layer comprises a transparent conductive oxide. As a result, by way of example, an electrical contact between the semiconductor chip and the optical element or a contact element can also be made possible, such that electrical contact can be made with the semiconductor chip via the optical element or the contact element and the connecting layer. Furthermore, a connecting layer comprising a transparent conductive oxide can also serve for current distribution, for example. Transparent conductive oxides ("TCO") are transparent, electrically conductive materials, generally metal oxides, such as, for example, zinc oxide, tin oxide, cadmium oxide, titanium oxide, indium oxide or indium tin oxide (ITO). Alongside binary metal-oxygen compounds, such as, for example, ZnO, $SnO_2$ or $In_2O_3$, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides, also belong to the group of TCOs. Furthermore, it can be possible that the TCOs do not necessarily correspond to a stochiometric composition and can also be p- or n-doped.

In accordance with a further embodiment, the semiconductor chip has a surface which is directly adjoined by the connecting layer and which has a surface structure. Alternatively or additionally, the optical element can also have a surface which is directly adjoined by the connecting layer and which has a surface structure. In this case, the surface structure, that is to say the surface structure of the semiconductor chip and/or the surface structure of the optical element, can be at least partly or completely covered by the connecting layer. In particular, the surface structure is situated between the optical element and the semiconductor chip, such that, before the connecting layer is applied, cavities are formed by the surface structure between the optical element and the semiconductor chip. Said cavities can be at least partly or completely covered by the connecting layer. However, it may also be the case that pores are formed in the connecting layer as a result of the cavity walls being covered with the connecting layer.

In accordance with a further embodiment, the surface structure has at least one channel which extends from an edge region of the surface along a main extension plane of the surface to an inner region of the surface. Through the channel, therefore, the inner region of the surface can be accessible from outside, such that the gases used for applying the connecting layer can be transported into the inner region via the channel. In this case, the channel can serve as access to gaps and cavities formed by the surface structure in the inner region, for example, and can be dimensioned in such a way that the channel is occupied by only little growth during the growth of the connecting layer, whereas thinner gaps and smaller cavities are filled, and an optical and mechanical coupling between the semiconductor chip and the optical element is thus made possible. The at least one channel can be formed, for example, by etching in the semiconductor chip or in the optical element. Relative to the dimensions of the semiconductor chip or of the optical element, the at least one channel can be continuous and thus extend from one edge region of the semiconductor chip or of the optical element to another edge region of the semiconductor chip or of the optical element. It is also possible for the at least one channel to be embodied as a blind channel or blind trench and to extend from the edge region only into the inner region.

The choice of a suitable surface structure is crucial for the functionality of the connecting layer and the applicability of the method described here and also for the optical efficiency of the optoelectronic semiconductor component, since the surface of the semiconductor chip and/or of the optical element in accordance with further embodiments described here can also have additional functions, for example, scattering as a result of roughening or current distribution via a conductive connecting layer. In particular, the use of the ALD method with the possibility of the atomic-layer-fine deposition of the connecting layer together with a suitable surface structuring of the semiconductor chip and/or of the optical element makes possible a mechanical and, in particular, cohesive and also an optical coupling of the optical element via a thin transparent connecting layer, in particular via a thin transparent oxide layer as connecting layer.

In this case, firstly, the structuring of the surface of the semiconductor chip and/or of the optical element must be oriented toward an optimum supply of the gases used during the ALD method and an efficient and controlled process implementation associated therewith. Secondly, it is also necessary to achieve an optimum optical coupling of the optical element to the semiconductor chip, in particular by means of a large interface between them, which is formed by the connecting layer, with small maximum gap values. The optimum surface structure is thus provided by the refractive indexes of the semiconductor chip and of the optical element.

For suitable dimensioning of the at least one channel and, in particular, of the aspect ratio thereof, it is helpful, for example, to theoretically estimate the ALD diffusion and to carry out an optical and thermal modeling with regard to the efficiency and the coupling area. With regard to the requirements in respect of planarity or the roughness of the surface structure it has been found that it is particularly advantageous if the roughening of the surface structure has a roughness that is less than approximately twice the thickness of the connecting layer. Given a suitable thickness of the connecting layer, the latter can furthermore also serve as a reflection-reducing coating ("antireflection coating:" AR coating) for the light generated in the semiconductor chip.

In accordance with a further embodiment, the at least one channel has a length along which it extends from the edge region to the inner region. Furthermore, the channel has a diameter or width denoting, for example, the narrowest location of the channel. As described further below, for example, in connection with the Figures, in particular an aspect ratio of length to diameter or width of the channel of less than or equal to 500, preferably less than or equal to 200, and particularly preferably less than or equal to 100, can be particularly advantageous in order to achieve an optimum supply of the gases used during the ALD method from the edge region to the inner region between the semiconductor chip and the optical element.

In accordance with a further embodiment, the surface structure has a plurality of channels. The channels can be arranged uniformly alongside one another and spaced apart from one another. Furthermore, it is also possible for channels to cross one another and thus to run from different edge regions to the inner region. In particular, the channels, for example channels that cross one another, can be embodied in each case as continuous channels which extend from one edge region to an opposite edge region of the semiconductor chip or of the optical element.

In accordance with a further embodiment, the surface structure has a roughening. The roughening can be formed, for example, by randomly arranged elevations and depressions which can be produced, for example, by etching or mechanically removing methods such as sandblasting, for instance. Furthermore, the roughening can also be produced by specific crystal growth conditions on a surface of the semiconductor chip. It is also possible for the elevations and depressions of the roughening to be embodied as regular or at least partly regular and/or of identical type or at least partly of identical type. By way of example, the roughening can have plateau-type elevations. The depressions can be connected to one another and thus form at least one channel or a plurality of channels that cross one another or branched channels.

In accordance with a further embodiment, the surface structure has lens-shaped and/or pyramidal elevations. In particular, the pyramidal elevations can also be embodied as truncated pyramids or in a plateau-type fashion. It is particularly advantageous if the roughening of the surface of the semiconductor chip which directly adjoins the connecting layer forms as many oblique facets as possible, which enable light to be coupled out effectively. Furthermore, the surface and thus also the surface structure should form coupling areas that are as large as possible.

Furthermore, it may also be possible for the surface structure to have at least one or a plurality of channels in addition to the roughening. The at least one channel or the plurality of channels can in particular have dimensions, that is to say a respective length and/or width, greater than the dimensions of the depressions formed by the roughening.

For example in the case of semiconductor chips having dimensions of less than or equal to 300 μm, the surface structure can be formed solely by the roughening. In the case of larger semiconductor chips having dimensions for example in the range of 1 mm, the aspect ratio in the case of a standard roughening is approximately 1,000, with the result that, in the case of such large semiconductor chips, at least one additional channel in the surface of the semiconductor chip or in the surface of the optical element may prove to be advantageous. In this regard, by way of example, one or a plurality of channels having a diameter of approximately 5 μm can reduce the aspect ratio given by the roughening by approximately a factor of 10.

In accordance with a further embodiment, that surface of the semiconductor chip which directly adjoins the connecting layer has a surface structure formed by a roughening. In addition, that surface of the optical element which directly adjoins the connecting layer has a surface structure formed by at least one channel having a larger dimension than the roughening.

In accordance with a further embodiment, the surface structure has regularly arranged elevations. The elevations can be embodied for example as free-standing elevations, that is to say, for example, in a hill-shaped or tower-shaped fashion, and can be separated from one another by channels or depressions that cross one another. By way of example, a regular arrangement of elevations can form a photonic crystal. Such a photonic crystal can be formed, for example, by elevations which are arranged regularly alongside one another and have a filling factor of at least 50% and a structure size of at least 400 nm. In this case, it can be advantageous if the surface structure has structure sizes which are as small as possible in conjunction with an efficiency sought, in order to keep the aspect ratio for filling the depressions or gaps within limits. In particular, the order of magnitude of the structures can lie in an order of magnitude range of the emitted wavelength, or wavelength to be received, of the semiconductor chip.

In accordance with a further embodiment, both the semiconductor chip and the optical element in each case have a surface structure, the connecting layer being arranged between these surface structures, the connecting layer directly adjoining these surface structures, and these surface structures intermeshing. In other words, the surface structures of the semiconductor chip and of the optical element can be interlocked with one another or be embodied in a tongue-and-groove-like arrangement. As a result, it is possible to achieve an increase in the area overlap of the surface of the semiconductor chip and the surface of the optical element which in each case directly adjoin the connecting layer. In accordance with a further embodiment, the surface structure has an average structure size that is less than or equal to twice the thickness, in particular the average thickness, of the connecting layer. In this case, the structure size can be defined by the average roughness in the case of a random arrangement or roughening of elevations and depressions or else in a manner averaged over the structures of the surface structure in the case of a regular arrangement.

In accordance with a further embodiment, for producing the optoelectronic semiconductor component, a plurality of semiconductor chips and a plurality of optical elements are provided, which are formed in each case in an assemblage. By way of example, the semiconductor chips can be present in a wafer assemblage. The plurality of optical elements can be manufactured jointly and be present for example in the form of a disk or a disk assemblage. The assemblage of the semiconductor chips and the assemblage of the optical elements are arranged one on top of another, such that a respective optical element is arranged on a semiconductor chip. Afterward, the connecting layer is applied by means of the ALD method described above between the assemblage of the semiconductor chips and the assemblage of the optical elements, as a result of which the plurality of optical elements are fixed on the plurality of semiconductor chips. After the connecting layer has been applied, individual optoelectronic semiconductor components can be released from the assemblage by singulation. The singulation can be effected by sawing, cutting or etching, for example.

In accordance with a further embodiment, the optical element has at least one further channel extending perpendicularly to the main extension plane of the optical element or the connecting layer from a surface facing away from the semiconductor chip into the optical element or particularly preferably into an assemblage comprising optical elements. Such a perpendicular channel can serve as a further access channel for the gases used during the ALD method. Particularly in the case of the arrangement of a plurality of optical elements in the assemblage on an assemblage of semiconductor chips, one or a plurality of such perpendicular channels can be arranged in the assemblage of the optical elements. In this case, it can be particularly advantageous if the perpendicular channels, which are embodied for example as holes or gaps, are arranged in separating trenches between optical elements, which are provided for subsequent singulation into individual optoelectronic semiconductor components. Alternatively or additionally, such perpendicular channels can also be formed in the assemblage of the semiconductor chips, in particular there as well in separating trenches.

In accordance with a further embodiment, the optoelectronic semiconductor component comprises a further optical element on the optical element, that is to say on that side of the optical element which faces away from the semiconductor chip. A further connecting layer comprising a transparent oxide can be arranged in a manner directly adjoining the optical element and the further optical element, and fixes the further optical element on the optical element. In this case, the further optical element can have features in accordance with the abovementioned embodiments for the optical element. The further connecting layer can have features in accordance with the embodiments for the connecting layer.

BRIEF DESCRIPTION OF THE DRAWINGS

Further advantages, advantageous embodiments and developments will become apparent from the exemplary embodiments described below in conjunction with the figures.

FIGS. 2A to 4 show schematic illustrations of optoelectronic semiconductor components in accordance with further exemplary embodiments;

In the exemplary embodiments and figures, elements that are identical, of identical type or act identically may be provided in each case with the same reference signs. The illustrated elements and their size relationships among one another should not be regarded as true to scale; but rather, individual elements, such as, for example, layers, structural parts, components and regions, may be illustrated with an exaggerated size in order to enable better illustration and/or in order to afford a better understanding.

DETAILED DESCRIPTION OF ILLUSTRATIVE EMBODIMENTS

Figure 1A:
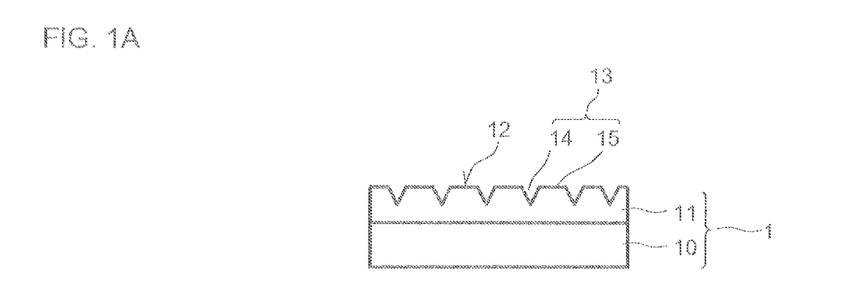
FIGS. 1A to 1C show method steps for a method for fabricating an optoelectronic semiconductor component in accordance with one exemplary embodiment.
Figure 1B:
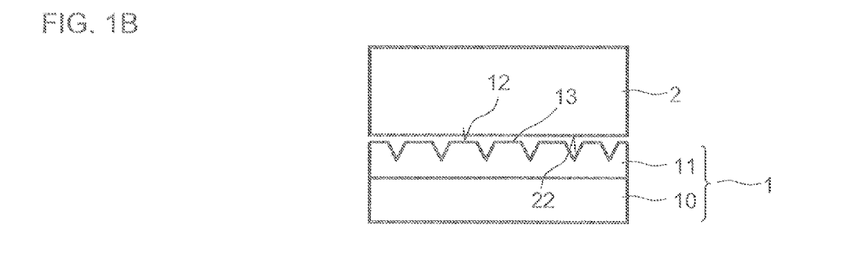
Figure 1C:
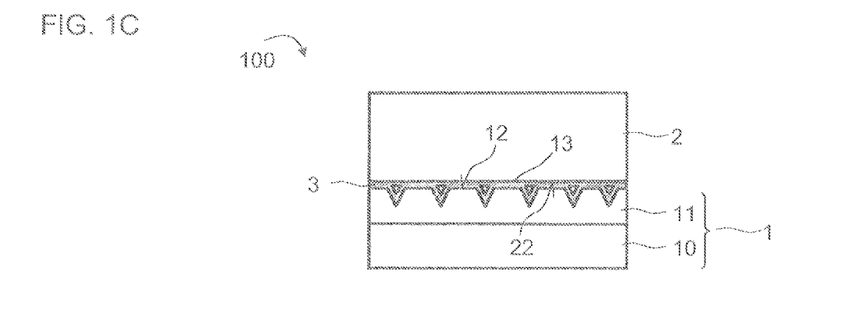

FIGS. 1A to 1C show one exemplary embodiment of a method for fabricating an optoelectronic semiconductor component 100.

In a first method step in accordance with FIG. 1A, an optoelectronic semiconductor chip 1 is provided. The semiconductor chip 1 has a substrate 10, on which a semiconductor layer sequence 11 is arranged. The substrate 10 can be a growth substrate, for example, on which the semiconductor layer sequence 11 is grown. As an alternative thereto, it may also be possible that the semiconductor layer sequence 11 was grown on a growth substrate and was subsequently transferred to the substrate 10, which is then embodied as a carrier substrate.

The semiconductor layer sequence 11 and the semiconductor chip 1 can have features in accordance with the description in the general part. In the exemplary embodiment shown, the semiconductor layer sequence 11 is based on a nitride compound semiconductor material or a phosphide compound semiconductor material, that is to say, for example, on a GaN semiconductor material or an InGaAlP semiconductor material. Purely by way of example, the semiconductor chips 1 shown in the figures are embodied as light emitting semiconductor chips. As an alternative thereto, it is also possible to use light detecting semiconductor chips, that is to say, for example, photodiodes or photovoltaic cells, in the exemplary embodiments shown.

The semiconductor layer sequence 11 has a surface 12 arranged in a manner facing away from the substrate 10. A surface structure 13 is formed on the surface 12, said surface structure being formed by a roughening 15 in the exemplary embodiment shown. The roughening 15 can be produced, for example, by the crystal growth during the growth of the semiconductor layer sequence 11 or else by subsequent processing such as etching, for example.

The roughening 15 has elevations which are embodied in a truncated-pyramid-type or plateau-type fashion and which are separated from one another by channels 14. The roughening 15 serves, in particular, for increasing the optical coupling-out of the light generated in the semiconductor chip 1 by providing as many oblique facets as possible.

In a further method step in accordance with FIG. 1B, an optical element 2 is arranged on the surface 12. The optical element 2 is embodied as a transparent substrate in the exemplary embodiment shown. As an alternative thereto, it is also possible for the optical element to be embodied, for example, as a wavelength conversion element or as a scattering element. Features concerning a transparent substrate, a wavelength conversion element comprising at least one wavelength conversion substance or a scattering element comprising scattering bodies or scattering centers are described above in the general part. The arrangement of the optical element 2 on the surface 12 of the semiconductor chip 1 results in gaps and channels between the optical element 2 and the semiconductor chip 1, which is indicated here and in the following exemplary embodiments by the optical element 2 being arranged in a manner slightly spaced apart from the semiconductor chip 1. The gaps can arise for example as a result of surface structures and surface irregularities that are present on account of manufacturing tolerances or are produced in a targeted manner. As a result of the plateau-type roughening 15, as many mechanical coupling areas as possible can also be provided besides the coupling-out facets mentioned above.

In a further method step in accordance with FIG. 1C, a connecting layer 3 is applied between the optical element 2 and the semiconductor chip 1 after the arrangement of the optical element 2 on the semiconductor chip 1. The connecting layer 3 comprises a transparent oxide, for example a dielectric transparent oxide such as, for instance, aluminum oxide, titanium dioxide, zirconium dioxide, tantalum pentoxide, hafnium dioxide, silicon dioxide, silicon nitride. Alternatively or additionally, the connecting layer 3 can also comprise a transparent conductive oxide, for example indium tin oxide or zinc oxide. The connecting layer 3 is applied by means of the ALD method described above in the general part. As a result of the high gap penetration of the ALD method and its conformal filling behavior described above in the general part, the connecting layer 3 can be applied in a manner directly adjoining the surface 12 of the semiconductor chip and the surface 22 of the optical element 2 that faces the semiconductor chip 1. This results in a so-called thin-gap adhesive bond and a mechanical and, in particular, cohesive fixing of the optical element 2 on the semiconductor chip 1.

The optoelectronic semiconductor component 100 fabricated in this way thus comprises the connecting layer 3 between the semiconductor chip 1 and the optical element 2, wherein the connecting layer 3 directly adjoins the surface 12 of the semiconductor chip 1 and directly adjoins the surface 22 of the optical element 2. As indicated by the cavities in the connecting layer 3 in FIG. 1C, not necessarily all channels 14 or all cavities between the optical element 2 and the semiconductor chip 1 must be filled during the filling of the channels 14 and the gaps between the optical element 2 and the semiconductor chip 1.

In particular, a transparent oxide having a refractive index of greater than 1.55 and preferably of greater than or equal to the refractive index of the optical element 2 is chosen as material for the connecting layer 3. Optical losses that arise, for example, in the case of conventional silicone adhesives for fixing optical elements on light emitting diode chips can be avoided as a result.

The connecting layer has a thickness corresponding, for instance, to half of the structure size of the roughening 15, that is to say the roughness in the exemplary embodiment shown. In other words, the average structure size is preferably less than or equal to twice the thickness of the connecting layer 3.

If the optical element 2 is embodied as a wavelength conversion element, for example as a ceramic wavelength conversion element comprising a ceramic wavelength conversion substance in a ceramic matrix or a glass matrix, then a good thermal and optical linking of the wavelength conversion element to the semiconductor chip 1 arises, which can result in an increase in the efficiency of the semiconductor component 100.

Alternatively or additionally, the optical element 2 can likewise have a surface structure for example in the form of a roughening on the surface 2. Exemplary embodiments of optoelectronic semiconductor component comprising an optical element 2 having a surface structure on the surface 22 are shown in further exemplary embodiments.

Figure 1D:
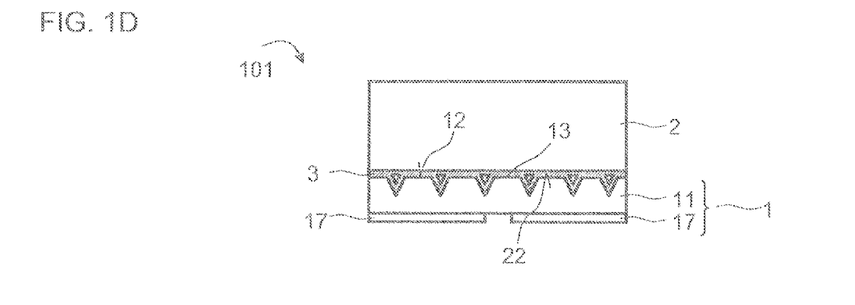
FIG. 1D shows a further method step for fabricating an optoelectronic semiconductor component in accordance with a further exemplary embodiment.

FIG. 1D shows a further method step of a method for fabricating an optoelectronic semiconductor component 101, wherein, proceeding from the method steps in accordance with FIGS. 1A to 1C, the substrate 10 is removed after the arrangement and fixing of the optical element 2 on the surface 12 of the semiconductor chip 1 by means of the connecting layer 3. Contacts 17 for making contact with the semiconductor layer sequence 11 are applied to the then exposed side of the semiconductor layer sequence 11 situated opposite the optical element 2. The optoelectronic semiconductor component 101 is embodied as a so-called flip-chip which can be arranged by means of the contacts 17 on a carrier, for example a ceramic substrate, a leadframe, a printed circuit board or a light emitting diode housing.

Alternatively, it is also possible for the semiconductor chip 1 shown in FIG. 1A already to be arranged on a carrier before the optical element 2 is applied.

The optical element 2, which can be embodied, for example, as mentioned above as a transparent substrate, as a wavelength conversion element or as a scattering element, can also lead to the stabilization of the semiconductor layer sequence 11 and thus of the entire semiconductor component 101 in particular in the embodiment of the semiconductor component 101 as a flip-chip.

The following figures show further embodiments of optoelectronic semiconductor components which constitute modifications of the exemplary embodiments shown previously. The following description is therefore substantially restricted to the differences with respect to the previous exemplary embodiments.

Figure 2A:
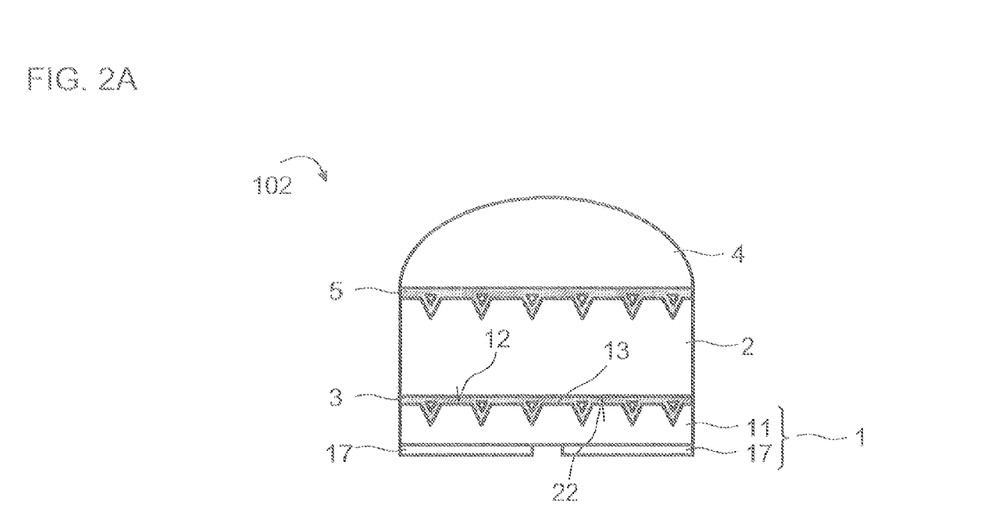
Figure 2B:
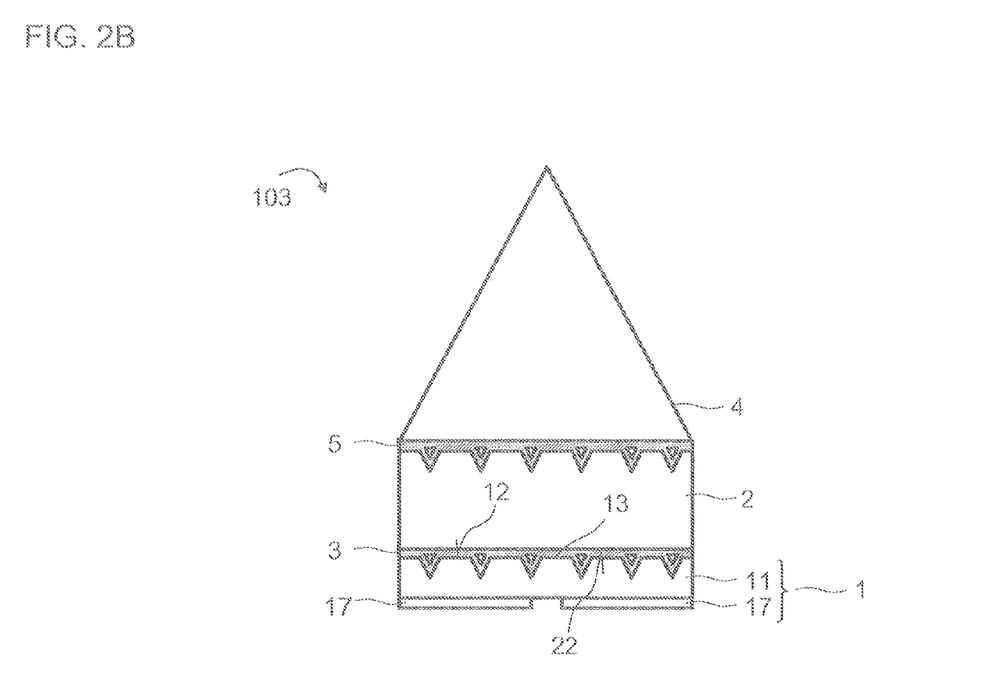

FIGS. 2A and 2B show further exemplary embodiments of optoelectronic semiconductor components 102 and 103, which comprise, in addition to the optical element 2 on the semiconductor chip 1, a further optical element 4 on the optical element 2. The further optical element 4 is embodied in a lens-like fashion in the exemplary embodiment in accordance with FIG. 2A and in a pyramidal or conical fashion in the exemplary embodiment in accordance with FIG. 2B. As an alternative or in addition thereto, it is also possible for the further optical element 4 to be embodied, for example, as a wavelength conversion element or as a scattering element comprising scattering centers or scattering structures.

The further optical element 4 is fixed on the optical element 2 by means of a further connecting layer 5. In particular, the optical element 2 in the exemplary embodiments shown has a surface structure on the side facing away from the semiconductor chip 1, which surface structure can serve firstly for optical coupling-out and secondly for enlarging the surface area. By means of an ALD method, the further connecting layer 5 is applied in a manner in each case directly adjoining the optical element 2 and the further optical element 4 after the arrangement of the further optical element 4 on the optical element 2. In this case, it may also be possible for the connecting layers 3 and 5 to be produced simultaneously. In particular, the further connecting layer 5 can have features as described for the connecting layer 3.

For the exemplary embodiments in the following figures, the connecting layer 3 is not shown, for the sake of clarity.

Figure 3A:
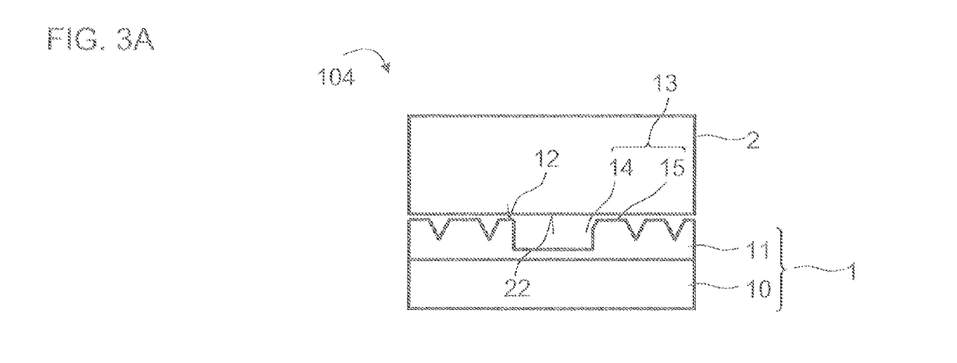
Figure 3B:
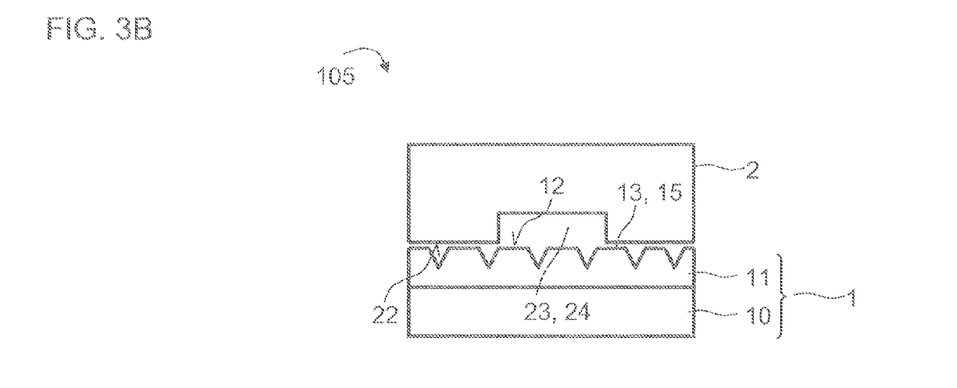
Figure 3C:
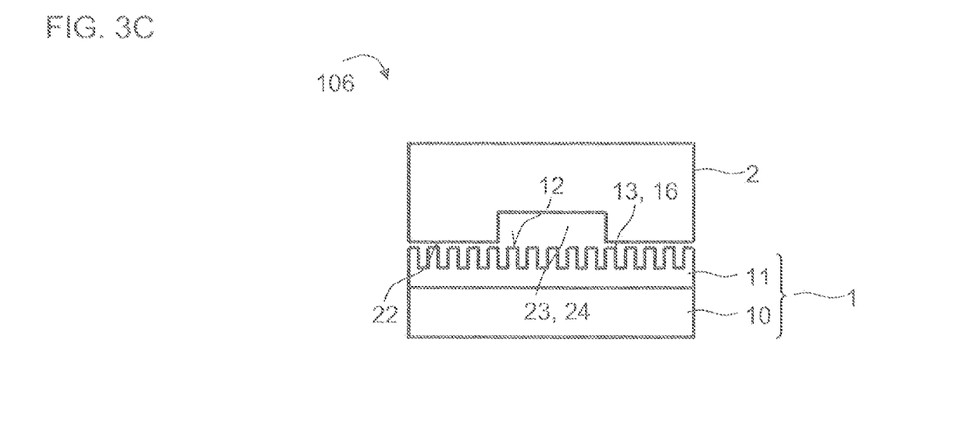

FIGS. 3A to 3C show further exemplary embodiments of optoelectronic semiconductor components 104, 105 and 106, which additionally comprise a surface structure 13, 23 having a channel 14, 24 in the surface 12 of the semiconductor chip 1 (FIG. 3A) or in the surface 22 of the optical element 2 (FIGS. 3B and 3C). Instead of one channel 14, 24, for example, it is also possible in each case for a plurality of channels to be present. It is also possible for in each case at least one channel 14, 24 to be formed both in the semiconductor chip 1 and in the optical element 2.

The at least one channel 14, 24 extends from an edge region of the surface 12, 22 in the surface 12, 22 along a main extension plane of the surface 12, 22 from an edge region to an inner region, thus into the plane of the drawing in the exemplary embodiments or figures shown. In this case, the respective channel 14, 24 can be produced by etching, for example, and can be embodied in a continuous fashion, that is to say in a manner extending from one edge region to an opposite edge region, or else as a blind trench. As a result of a surface structure 13, 23 having at least one channel 14, 24, internal regions, that is to say the inner region, and in particular gaps at the interface between the surfaces 12, 22 can be more easily accessible from outside, that is to say from the edge region.

In order to determine suitable dimensions of the at least one channel 14, 24, the length of time for which the ALD method must be carried out, that is to say the so-called exposure time, can be estimated theoretically. By way of example, the at least one channel 14, 24 can have a length along which it extends from the edge region toward the inner region. Furthermore, the at least one channel 14, 24 can have a diameter that specifies the width, in particular the minimum width, of the channel 14, 24 perpendicular to the length. If the channel 14, 24 has, for example, a diameter of 0.5 µm in conjunction with a length of 500 µm, then this corresponds to an aspect ratio a of approximately 1000. By contrast, if a roughening is assumed such as is shown, for example, in FIG. 1A and which has plateaus, then an aspect ratio a of approximately 100 results given a radius of 0.5 µm and given gap widths of less than 5 mm. This reveals that the dimensions for a channel 14, 24 embodied as a supply line channel are dominant, particularly the minimum gap width being crucial in the case of the plateau-type roughening shown by way of example.

Figure 7A:
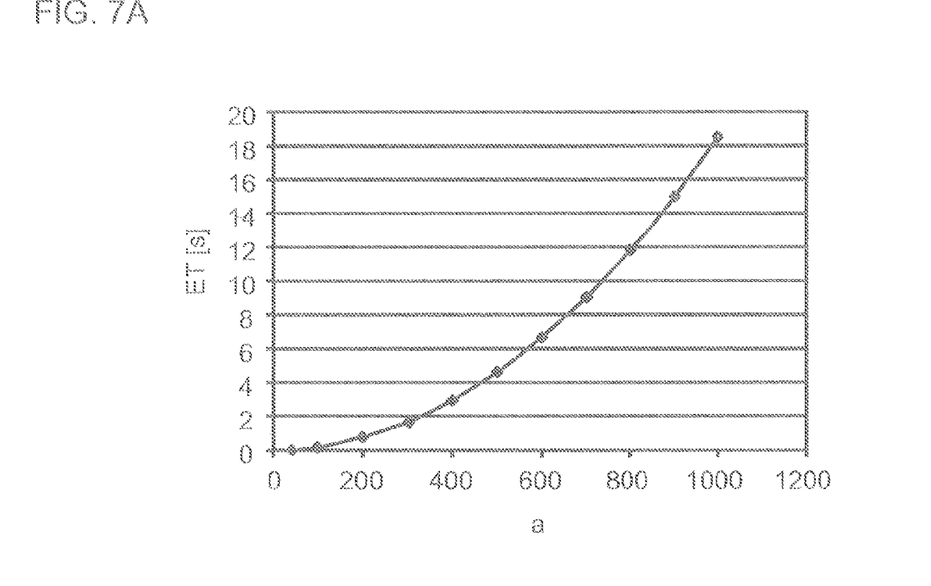
FIGS. 7A and 7B show estimations with regard to the method time for a method in accordance with a further exemplary embodiment.
Figure 7B:
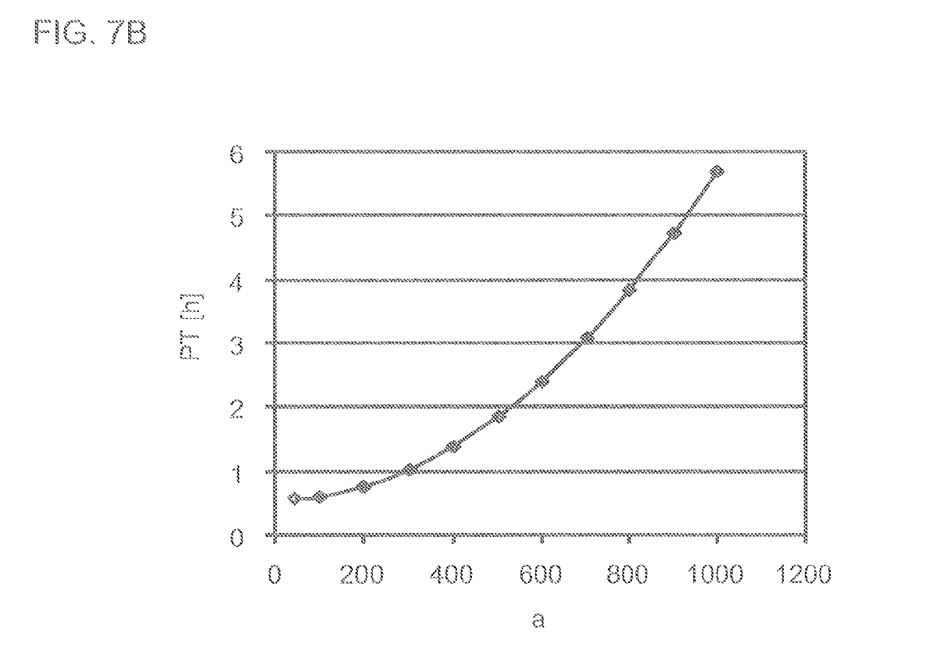

FIG. 7A shows an estimation of the exposure time ET in seconds as a function of the aspect ratio, that is to say the ratio of length to diameter of the channel, said exposure time being necessary in order to apply a layer composed of hafnium dioxide at a precursor pressure of approximately 0.2 mbar or approximately 0.263 torr. FIG. 7B shows the corresponding process time PT in hours as a function of the aspect ratio, said process time being necessary in order to apply a layer having a thickness of approximately 100 nm. It is evident from the curves shown that the exposure time ET or respectively the process time PT rises quadratically with the aspect ratio. The estimations in FIGS. 7A and 7B are based on the document R. Gordon et al., "A Kinetic Model for Step Coverage by Atomic Layer Deposition in Narrow Holes or Trenches," Chem. Vap. Deposition, 9(2), 2003, 73, the disclosure content of which within its full scope is hereby incorporated by reference.

This reveals that an aspect ratio of length to diameter of less than or equal to 500, in particular of less than or equal to 200, and particularly preferably of less than or equal to 100, for the at least one channel 14, 24 is particularly advantageous.

The at least one channel 14, 24 enables an optimum and efficient distribution of the precursor gases during the application of the connecting layer 3 by means of the ALD method into as far as possible all gap areas between the semiconductor chip 1 and the optical element 2. The length and the diameter of the at least one channel 14, 24 are adapted to the chip size such that the aspect ratio of length to diameter does not become much greater than 100 during the ALD method as well, in order not to significantly increase the process times and thus the costs. By means of the at least one channel 14, 24 or, if appropriate, by means of a plurality of channels, it is possible to achieve a homogeneous coating between and adjoining the surfaces 12, 22 of the semiconductor chip 1 and of the optical element 2, which coating leads to economic process times even in the case of large chip sizes of, for example, greater than 300 µm for the chip side edges, that is to say for example in the range of 1 mm. In order that in particular the light emitting region or the light emitting layer of the semiconductor chip 1 is made as large as possible, it can be advantageous, in particular, in accordance with the exemplary embodiments in FIGS. 3B and 3C, to form the at least one channel 24 or a plurality of channels as surface structure 23 in the surface 22 of the optical element 2.

In comparison with the exemplary embodiments in FIGS. 1A to 3B, the semiconductor chip 1 in accordance with the exemplary embodiment in FIG. 3C has, as surface structure 13, a regular arrangement of elevations which are separated from one another by trenches and which form a photonic crystal 16. The latter preferably has a filling factor of at least 50% and a structure size of at least 400 nm, wherein the structure shown with free-standing elevations and a continuous deep plane formed by the trenches between the elevations is preferably used for an efficient distribution of the gases during the ALD method for applying the connecting layer 3. In order that, for a given efficiency, the aspect ratio for ever growing gaps is kept within limits, it is advantageous to keep the structure size as small as possible.

Figure 4:
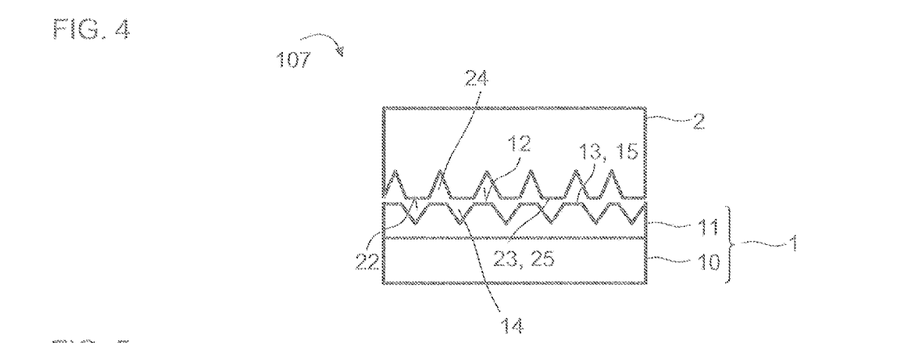

FIG. 4 shows a further exemplary embodiment of an optoelectronic semiconductor component 107, wherein the surface 12 of the semiconductor chip 1 and the surface 22 of the optical element 2 in each case have a roughening 15, 25 as surface structure 13, 23, which are structured in the form of a tongue-and-groove principle and can be interlocked in one another. A particularly efficient coupling of the optical element 2 to the semiconductor chip 1 can be achieved by the application of the connecting layer 3 and the interlocked surface structures 13, 23.

Figure 5:
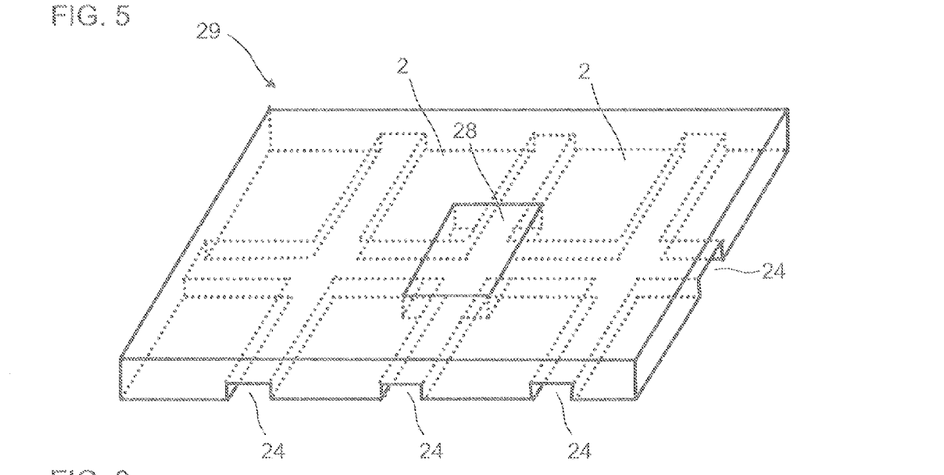
FIG. 5 shows an assemblage comprising optical elements in accordance with a further exemplary embodiment.

FIG. 5 shows an assemblage 29 comprising a plurality of optical elements 2. The optical elements 2 can be manufactured jointly for example in the assemblage 29. Such an assemblage 29 is particularly suitable for fabricating a plurality of optoelectronic semiconductor components as shown in conjunction with FIG. 6.

The assemblage 29 comprising the optical components 2 has channels 14 which are arranged such that they cross one another and which can simultaneously form separating trenches for later singulation. Furthermore, the assemblage 29 has a further channel 28, which extends perpendicularly to the main extension plane of the assemblage 29 into the assemblage 29 and thus into the optical elements 2.

Figure 6:
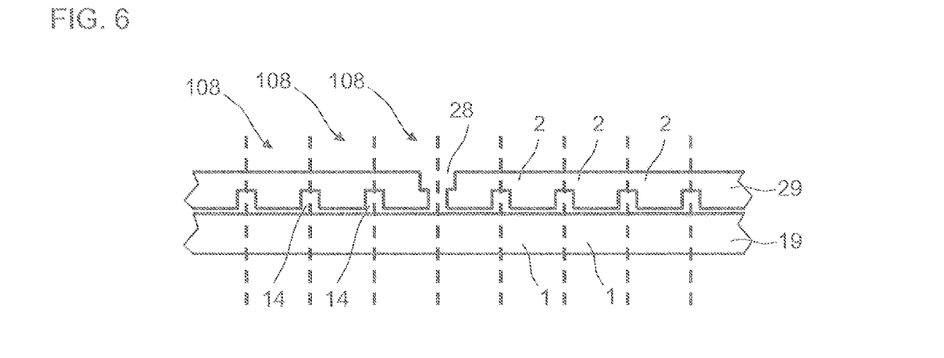
FIG. 6 shows a method step for a method for fabricating optoelectronic semiconductor components in accordance with a further exemplary embodiment.

FIG. 6 shows a method step in accordance with a further exemplary embodiment, wherein an assemblage 19 comprising a plurality of semiconductor chips 1 present, for example, in the form of a wafer assemblage is provided. On this assemblage there is arranged the assemblage 29 comprising the plurality of optical elements 2 as shown in FIG. 5. A connecting layer is subsequently applied between the assemblage 19 and the assemblage 29 in a manner directly adjoining them by means of an ALD method. What can be achieved by means of the channels 14 and 28 is that the aspect ratio of the interspaces and gaps between the assemblage 19 and the assemblage 29 is preferably less than or equal to 100, such that the fixing of the assemblage 29 on the assemblage 19 by means of an ALD-applied connecting layer can be carried out in an economic time frame. Along the singulation lines indicated by means of the dashed lines, the semiconductor chips 1 and optical elements 2 joined together in the assemblage can subsequently be singulated into individual optoelectronic semiconductor components 108.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic semiconductor component comprising:
   an optoelectronic semiconductor chip;
   an optical element; and
   a connecting layer comprising a transparent oxide arranged between the semiconductor chip and the optical element, wherein the connecting layer directly adjoins the semiconductor chip and the optical element and fixes the optical element on the semiconductor chip;
   wherein the optical element has at least one further channel that extends perpendicularly to a main extension plane of the connecting layer from a surface facing away from the semiconductor chip through into the optical element.

2. The semiconductor component according to claim 1, wherein the connecting layer directly adjoins a surface of the semiconductor chip having a surface structure and/or a surface of the optical element having a surface structure.

3. The semiconductor component according to claim 2, wherein the surface structure has at least one channel which extends in the surface from an edge region of the surface along a main extension plane of the surface to an inner region.

4. The semiconductor component according to claim 3, wherein the channel has a length and a diameter wherein an aspect ratio of the length to the diameter is less than or equal to 500.

5. The semiconductor component according to claim 2, wherein the surface structure has a plurality of channels.

6. The semiconductor component according to claim 5, wherein the channels cross one another.

7. The semiconductor component according to claim 2, wherein the surface structure has a roughening.

8. The semiconductor component according to claim 2, wherein the surface structure has regularly arranged elevations.

9. The semiconductor component according to claim 2, wherein the surface structure has lens-shaped and/or pyramidal elevations.

10. The semiconductor component according to claim 2, wherein the semiconductor chip and the optical element each have a surface structure, the connecting layer being arranged between these surface structures and these surface structures intermeshing.

11. The semiconductor component according to claim 2, wherein the surface structure has an average structure size that is less than or equal to twice a thickness of the connecting layer.

12. The semiconductor component according to claim 1, wherein the connecting layer comprises a transparent conductive oxide and/or a dielectric oxide.

13. The semiconductor component according to claim 1, further comprising a further optical element arranged on the optical element; and
   a further connecting layer comprising a transparent oxide directly adjoining the optical element and the further optical element, the further connecting layer fixing the further optical element on the optical element.

14. A method for fabricating an optoelectronic semiconductor component, the method comprising:
   arranging an optical element on a semiconductor chip; and
   applying a connecting layer comprising a transparent oxide, the connecting layer applied, after the arranging the optical element on the semiconductor chip, by atomic layer deposition such that the connecting layer directly adjoins the semiconductor chip and the optical element and is disposed between the semiconductor chip and the optical element.

15. The method according to claim 14, wherein
   the semiconductor chip and the optical element are each provided as a plurality in an assemblage and arranged one on top of another, and
   after the connecting layer has been applied, individual optoelectronic semiconductor components are detached from the assemblage by singulation.

16. An optoelectronic semiconductor component comprising:
   an optoelectronic semiconductor chip;
   an optical element; and
   a connecting layer consisting of a transparent oxide arranged between the semiconductor chip and the optical element, the connecting layer directly adjoining the semiconductor chip and the optical element and fixing the optical element on the semiconductor chip;

wherein gaps between the optical element and the semiconductor chip, which are formed by arranging the optical element on the semiconductor chip, are partially filled.

17. An optoelectronic semiconductor component comprising:

an optoelectronic semiconductor chip;

an first optical element;

a first connecting layer comprising a first transparent oxide arranged between the semiconductor chip and the first optical element, wherein the first connecting layer directly adjoins the semiconductor chip and the first optical element and fixes the first optical element on the semiconductor chip;

a second optical element arranged on the first optical element; and a second connecting layer comprising a second transparent oxide directly adjoining the first optical element and the second optical element, the second connecting layer fixing the second optical element on the first optical element.

\* \* \* \* \*